United States Patent
Nagahashi et al.

(10) Patent No.: US 6,784,972 B2
(45) Date of Patent: *Aug. 31, 2004

(54) EXPOSURE APPARATUS, DEVICE MANUFACTURING METHOD AND ENVIRONMENTAL CONTROL METHOD OF EXPOSURE APPARATUS

(75) Inventors: Yoshitomo Nagahashi, Chiyoda-Ku (JP); Saburo Kamiya, Chiyoda-Ku (JP); Koichi Katsura, Chiyoda-Ku (JP)

(73) Assignee: Nikon Corporation, Tokyo (JP)

( * ) Notice: Subject to any disclaimer, the term of this patent is extended or adjusted under 35 U.S.C. 154(b) by 77 days.

This patent is subject to a terminal disclaimer.

(21) Appl. No.: 09/994,053

(22) Filed: Nov. 27, 2001

(65) Prior Publication Data

US 2002/0050572 A1 May 2, 2002

Related U.S. Application Data

(63) Continuation of application No. PCT/JP00/03267, filed on May 22, 2000.

(30) Foreign Application Priority Data

May 27, 1999 (JP) ........................................... 11-147543
Feb. 25, 2000 (JP) ....................................... 2000-048670

(51) Int. Cl.⁷ .......................... G03B 27/52; G03B 27/42
(52) U.S. Cl. .......................................... 355/30; 355/53
(58) Field of Search .............................. 355/53, 77, 30; 250/492.1

(56) References Cited

U.S. PATENT DOCUMENTS 5,508,518 A * 4/1996 Kendall ................... 250/492.2
5,871,587 A * 2/1999 Hasegawa et al. .......... 118/719
5,877,843 A   3/1999 Takagi et al.
6,208,406 B1 * 3/2001 Nakashima ................... 355/30
6,320,646 B1 * 11/2001 Mouri ......................... 355/53
6,356,338 B2 * 3/2002 Arakawa ....................... 355/30

FOREIGN PATENT DOCUMENTS

| JP | 4-22118 | 1/1992 | |
| JP | 5-129181 | 5/1993 | |
| JP | 6-176998 | * 6/1994 | ......... H01L/21/027 |
| JP | 5-318538 | 11/1994 | |
| JP | 7-130613 | 5/1995 | |
| JP | 9-82626 | 3/1997 | |

* cited by examiner

*Primary Examiner*—Russell Adams
*Assistant Examiner*—D. Ben Esplin
(74) *Attorney, Agent, or Firm*—Oblon, Spivak, McClelland, Maier & Neustadt, P.C.

(57) ABSTRACT

An air conditioner arranged in a machine chamber supplies gas for air conditioning into an exposure chamber via a supply path, and performs air conditioning of the exposure chamber. Then, the gas for air conditioning that has performed air conditioning returns to the machine chamber via an exhaust path. A chemical filter is provided in part of the exhaust path returning to the machine chamber from the exposure chamber. This filter securely removes contaminants that are introduced by outgassing and the like in an exposure apparatus main body and that are contained in the gas for air conditioning returning to the machine chamber from the exposure chamber. Accordingly, the inside of the exposure chamber can be kept chemically clean. Therefore, highly accurate exposure quantity control and thus highly accurate exposure can be performed for a long period of time, and high throughput can be maintained for a long period of time.

20 Claims, 6 Drawing Sheets

EXPOSURE APPARATUS, DEVICE MANUFACTURING METHOD AND ENVIRONMENTAL CONTROL METHOD OF EXPOSURE APPARATUS

CROSS-REFERENCE TO RELATED APPLICATIONS

This is a continuation of International Application PCT/JP00/03267, with an international filing date of May 22, 2000, the entire content of which being hereby incorporated herein by reference, which was not published in English.

BACKGROUND OF THE INVENTION

1. Field of the Invention

The present invention relates to an exposure apparatus, a device manufacturing method and an environmental control of an exposure apparatus. More particularly, the present invention relates to an exposure apparatus used in a lithography process in manufacturing semiconductor devices, liquid crystal display devices and the like, a device manufacturing method in which exposure is performed by using the exposure apparatus, and an environmental control method to keep environmental conditions inside an exposure chamber of the exposure apparatus substantially constant.

2. Description of The Related Art

In an apparatus performing processing for fine features such as a semiconductor exposure apparatus, an air conditioning system is provided to adjust temperatures therein because the temperatures need to be adjusted with extremely high accuracy. In this case, the air conditioning system needs to be a circulating system since very precise temperature adjustment needs to be performed within a range of, for example, ±0.1° C. relative to a target temperature. Accordingly, a blower is required for circulating air. In the exposure apparatus, a machine chamber housing an air conditioner including the blower is normally installed independently of a main body chamber housing an exposure apparatus main body because of problems of vibration and the like.

In the exposure apparatus that manufactures electronic devices such as LSI's and the like, pressure inside the main body chamber housing the exposure apparatus main body, which consists a reticle, a projection lens and the like, is usually set to be higher than that of the outside of the main body chamber. The air inside the main body chamber leaks to the outside due to a pressure difference between the inside and the outside of the main body chamber, air needs to be supplied from the outside to compensate for the lost air. Accordingly, an outside air inlet called an OA port is provided in part of a supply path of the air (a supply path) to the main body chamber, and outside air is normally, naturally fed through the OA port.

On the other hand, the air that has returned from the main body chamber enters the air conditioner in the machine chamber together with supply air from the outside. The air that has entered the air conditioner is cooled down by a cooler. At this point, excess moisture brought from the outside by the feeding of the outside air condenses on the radiation fins of the cooler and so is removed. Then, the air from which the excess moisture has been removed is heated to a given temperature by a heater, and sent into the main body chamber by the blower.

In addition, it has recently been found out that trace level gas in a clean room atmosphere has adverse effects on a semiconductor manufacturing apparatus such as a reduction projection exposure apparatus (a stepper) and the like. More specifically, in an excimer laser exposure apparatus, an X-ray exposure apparatus or an electron beam exposure apparatus, which uses an excimer laser such as a KrF excimer laser, an ArF excimer laser or the like as a light source, a high sensitive chemically amplified resist is used in order to compensate for insufficient brightness of the light source. The chemically amplified resist contains an acid-generating agent as a photosensitive agent, and acid generated by the agent upon exposure induces catalytic reaction in a subsequent thermal processing (PEB: post exposure bake) so as to make the exposed part of the resist insoluble (a negative type) or soluble (a positive type) in a developing solution. However, in the case of a positive resist, trace level basic gas of a ppb level in the atmosphere may neutralize acid catalyst generated on the surface of the positive type chemically amplified resist to form a hardly-soluble surface layer. In such a case, the phenomenon occurs that after being exposed and developed, a cross section of the resist, which should be rectangular, is made into a shape like a letter T (referred to as a T-shape) When such a hardly-soluble surface layer is formed, the benefit of using the chemically amplified resist, which is a high sensitive resist, is lost. In order to proceed to exposure, overcoat or the like is necessary, which reduces throughput.

Further, as the exposure light becomes shorter in wavelength and more intense in illuminance, the phenomenon also occurs that trace level gas in the atmosphere precipitates as tarnish substances, which adhere to the surfaces of optical members forming an illumination system. Such a phenomenon occurs due to photochemical reaction between the trace level gas in the atmosphere and the exposure light. Reactive substances are ammonia gas, sulfur oxide, organic silicon compound and the like in the air. As a result of generation of tarnish on the optical members forming the illumination system, the illuminance is greatly reduced so that the throughput is reduced.

Therefore, means for removing a trace of impurity gas in a clean room atmosphere are disclosed in, for example, Japanese Patent Laid-Open No. 6-77114 and the U.S. Pat. No. 5,430,303 corresponding thereto.

With respect to conventional exposure apparatuses, a method where an exposure apparatus main body, and a substrate transportation system transporting a photosensitive substrate such as a wafer or a mask transportation system are housed in one environmental control chamber, and another method where the exposure apparatus main body, and the substrate transportation system or the mask transportation system are housed in different environmental control chambers are known.

In both methods, either one of the following techniques has been adopted. One is that air is blown into the inside of the exposure chamber that houses the exposure apparatus main body sideways (side-flow) from the side other than a side where the substrate transportation system and the mask transportation system are installed, and the other one is that air is blown downward (down-flow) from the ceiling to the floor of the exposure chamber.

According to the invention disclosed in the foregoing Japanese Patent Laid-Open, a trace of impurity gas in a clean room atmosphere can be surely removed to a certain extent, and reduction in illuminance due to tarnish on the optical members and generation of the hardly-soluble surface layer of the chemically amplified resist can be limited.

Recently, however, as the feature sizes of semiconductor devices become finer, outgas from an adhesive agent, a sealing agent, paint and components used in exposure apparatuses, which caused no problem in the past, is coming to pose problems that cannot be ignored, and the exposure apparatus main body itself can be regarded as a source of contamination. To get rid of influences of the outgas, the insides of an exposure apparatuses are required to be chemically clean, and chemical filters to remove chemical substances are commonly installed in exposure apparatuses similarly to the invention disclosed in the foregoing Japanese Patent Laid-Open.

However, in a conventional exposure apparatus, since a filter that removes impurities is provided only at the outside air inlet or a supply path to the inside space of the main body chamber; chemically contaminated air containing outgas released from the exposure apparatus main body when performing air conditioning thereof returns to an air conditioner and then is sent into the chemical filter disposed in the supply path by a blower of the air conditioner. Accordingly, the lifetime of the chemical filter in the supply path shortens particularly, and the chemical filter must be frequently replaced with a new one. Further, design of the conventional exposure apparatus has made on the presupposition that replacement of the chemical filter is unnecessary during the life of the apparatus. That is, replacement of the chemical filter itself has never been taken into consideration. Therefore, a chemical filter other than the one at the outside air inlet is normally disposed in a position where replacement is difficult, and thus it takes a long time to replace the filter. Furthermore, since the door of the chamber must be kept open for a long time for replacing the chemical filter, chemically unclean air in the clean room outside the apparatus enters the apparatus, and it is difficult to maintain high cleanliness of the inside space.

Further, in the conventional exposure apparatus, a drain pipe is essential for temperature adjustment, and the drain pipe makes the air-conditioning portion of the apparatus open to the outside. Moreover, a heater and a cooler are often installed immediately before the blower in the structure of the apparatus, and pressure of the space around a drain pan is lower (by about −3 hPa) than that of the outside atmosphere due to a characteristic of the blower. Accordingly, the following unfavorable phenomena 'a' to 'd' may occur.

a. The drain pipe finally comes to be connected with other apparatuses in a semiconductor manufacturing factory, and pressure of the space around the drain pan is lower than that of the outside atmosphere. Therefore, impurity gas released from other manufacturing apparatuses may flow into the exposure apparatus via the drain pipe when the drain pan is not filled with water.

b. Chemical substances released into the atmosphere of each apparatus in chemical processes such as alkaline processing and acid processing performed in other manufacturing apparatuses dissolve into wastewater after use for temperature adjustment of each apparatus in a microscopical level. There is large possibility that the chemical substances flow into the exposure apparatus in a ppb level via the drain pipe. In many cases, no particular measures are taken for chemical contamination as long as the waste water flowing in a pipe line system does not contain chemical substances at high concentration. Furthermore, the pipe line system for wastewater after use for temperature adjustment may be communicated to a clean room outside the exposure apparatus.

c. There is a case where some water due to condensation of the cooler is in the drain pan depending on installation conditions of the exposure apparatus. In such a case, although the outside air does not enter the apparatus directly through the pipe line system, it may enter the apparatus indirectly through the water in the pan, which is not preferable either.

d. Even if the influence of the pipe line system is small, since the water in the drain pan does not flow out due to the influence of the lower pressure, the pan could be a secondary supply source of gas having adverse effects on the exposure apparatus because microbes and the like proliferate after a trace of gas in circulating air dissolves into the water and is condensed.

In addition, in an exposure apparatus that uses the foregoing conventional side-flow technique as the air conditioning technique in the exposure chamber, two or three side faces, i.e. the face of a side where the substrate transportation system or the mask transportation system is installed, the face of a side where a blow port that sends gas for air conditioning into the exposure chamber is disposed, and further, depending on the case, the face of a side where a machine chamber having the air conditioner therein is arranged, of the four side faces (right, left, front and rear) of the exposure chamber are necessarily blocked. In this case, maintenance of the exposure apparatus main body can only be performed from either side of two predetermined sides or a predetermine side, and the maintenance operation may be difficult depending on the shape and size of the empty space in the clean room where the exposure apparatus is installed.

On the other hand, in an exposure apparatus that uses the foregoing conventional down-flow technique, the maintenance operation of the exposure apparatus main body can be performed from three or two side faces other than the face of a side where the substrate transportation system or the mask transportation system is installed, or this side face and the face of a side where the machine chamber is arranged. However, the exposure apparatus of this technique needs a filter for removing dust (an air filter), a chemical filter and a plenum duct of the filter for removing dust. For this reason, the total height of the exposure apparatus increases, and thus the ceiling height of an expensive clean room (factory) in which the exposure apparatus is installed increases so that the equipment cost increases.

Against such background, a new exposure apparatus that contributes to improvement of productivity of micro-devices in terms of the capability of maintaining chemical cleanliness of the atmosphere inside the apparatus, processing capacity and the equipment cost is expected.

SUMMARY OF THE INVENTION

The present invention has been created under such circumstances, and its object is to provide an exposure apparatus and a device manufacturing method that can improve the productivity of the microdevice, and an environmental control method of the exposure apparatus.

According to the first aspect of this invention, there is provided a first exposure apparatus, comprising: an exposure apparatus main body that transfers a predetermined pattern onto a substrate; an exposure chamber that houses at least a part of the exposure apparatus main body, and in which environmental conditions are kept substantially constant; an air conditioner that performs air conditioning inside the exposure chamber; a machine chamber that houses at least a part of the air conditioner; a supply path of gas for air conditioning supplied from the machine chamber into the exposure chamber; a first chemical substance removing filter arranged in part of the supply path; an exhaust path that forms a path of the gas for air conditioning that returns to the machine chamber from the exposure chamber; and a second chemical substance removing filter arranged in part of the exhaust path to remove chemical impurities in the gas for air conditioning.

With this apparatus, the air conditioner arranged in the machine chamber supplies the gas for air conditioning via the supply path, and air conditioning inside the exposure chamber is performed. Then, the gas for air conditioning that has performed air conditioning returns to the machine chamber via the exhaust path. Here, the first chemical substance removing filter is arranged in part of the supply path, and the second chemical substance removing filter is provided in part of the exhaust path of the gas for air conditioning that returns to the machine chamber from the exposure chamber. Accordingly, prior to sending the gas for air conditioning into the exposure chamber (space housing at least a part of the exposure apparatus main body) by the air conditioner in the machine chamber, the first chemical substance removing filter arranged in part of the supply path removes chemical contaminants in the gas for air conditioning and the second chemical substance removing filter substantially securely removes contaminants, which are contained in the gas for air conditioning returning to the machine chamber from the exposure chamber and which were outgassed in exposure apparatus main body. As described, the inside of the exposure chamber can be kept highly, chemically clean, and thus occurrence of a problem such as illuminance reduction due to tarnish of the optical elements can be effectively suppressed for a long period of time. Therefore, highly accurate exposure quantity control and thus highly accurate exposure can be performed for a long period of time, increase of exposure time due to the illuminance reduction is effectively suppressed to maintain high throughput for a long period of time, and thus the productivity of micro-devices can be improved. Furthermore, since chemically clean gas for air conditioning, from which chemical contaminants have been removed by the second chemical substance removing filter arranged in part of the exhaust path of the gas for air conditioning returning to the machine chamber from the exposure chamber, is sent into the first chemical substance removing filter arranged in part of the supply path, the lifetime of the first chemical substance removing filter lengthens and replacement is not needed for a long period of time.

In the first exposure apparatus according to the present invention, it is desirable that the exposure chamber and the machine chamber be severally formed inside different chambers. In terms of vibration caused by the air conditioner in the machine chamber, the machine chamber is normally arranged independently of the exposure chamber. Further, in this case, since the exposure chamber and the machine chamber are formed in the different chambers and the chemical substance removing filter is arranged in part of the exhaust path returning to the machine chamber from the chamber where the exposure chamber is formed, the chemical substance removing filter can be readily replaced. Accordingly, the down time of the apparatus during replacement of the chemical substance removing filter shortens, and the processing capacity can be improved in the long term.

In this case, the exposure chamber and the machine chamber may be arranged close to each other on the floor, and the exposure chamber and the machine chamber may be connected with each other via a freely detachable connection unit.

Further, it is desirable that the connection unit be one to prevent the vibration caused in the air conditioner from transmitting to the exposure chamber, and for example, it may be constituted by an expandable and contractable bellows-like member. In such a case, since the vibration caused by the air conditioner in the machine chamber is absorbed by expansion of the bellows-like member that constitutes the connection unit, influences of the vibration on the exposure chamber can be reduced. Accordingly, reduction of exposure accuracy is suppressed and the yield of micro-devices can be improved as a result, and thus the productivity can also be improved.

In the first exposure apparatus according to the present invention, when the exposure chamber and the machine chamber are arranged close to each other on the floor and both of them are connected with each other via the freely detachable connection unit, the first chemical substance removing filter may be arranged in the vicinity of the connection unit. In such a case, the chemical substance removing filter arranged near the connection unit can be easily replaced after removing the connection unit, if necessary.

In the first exposure apparatus according to the present invention, the exposure chamber and the machine chamber may be formed in a same chamber. As described above, in terms of the vibration caused by the air conditioner in the machine chamber, the machine chamber is normally arranged independently of the exposure chamber. However, since the problem of vibration can be solved with another means, the exposure chamber and the machine chamber may be formed by dividing one chamber with a partition.

In the first exposure apparatus according to the present invention, the machine chamber may be provided with an outside air inlet, and the exposure apparatus may further comprise a third chemical substance removing filter arranged in a path of air that is taken in through the outside air inlet. In such a case, air in the clean room where the exposure apparatus is installed is taken into the apparatus. Since the chemical substance removing filter is provided in the path of the air taken in, air from the outside, which has been cleaned, is taken into the apparatus so that cleanliness inside the apparatus is not reduced. Therefore, the pressure inside the exposure chamber can be kept higher than that of the outside atmosphere to maintain high cleanliness.

In the first exposure apparatus according to the present invention, the entire supply path and the entire exhaust path for the air-conditioning gas is preferably made of a material outgassing less. Particularly, part of the supply path that is downstream of the first chemical substance removing filter is preferably made of a material outgassing less. In such a case, since little outgas is released in the supply path downstream of the first chemical substance filter arranged in part of the supply path, chemically clean gas for air conditioning can be sent into the exposure chamber (space that houses at least a part of the exposure apparatus main body).

In the first exposure apparatus according to the present invention, when the first chemical substance removing filter is arranged in part of the supply path, the supply path may be divided into a plurality of paths in the downstream of the first chemical substance removing filter arranged in part of the supply path, and each of the plurality of paths may be connected to a respective chamber of a plurality of different chambers including the exposure chamber.

In this case, each of the plurality of paths is preferably provided with an air filter to remove particles in the vicinity of a blow port of the gas for air conditioning to each of the plurality of different chambers. In such a case, since the exposure apparatus can be installed in a clean room having relatively low cleanliness of class about 100 to 1000, the maintenance cost of the clean room can be reduced.

In the first exposure apparatus according to the present invention, the air conditioner includes a cooler that cools the gas for air conditioning that circulates within the machine chamber, and a heater that heats the cooled gas, and the exposure apparatus may further comprise a controller that controls the surface temperature of the cooler so that condensation does not occur. In such a case, since the controller controls the surface temperature of the cooler to a temperature where condensation does not occur, the drain pipe system of the air conditioner is not needed. Accordingly, occurrence of problems such as the foregoing 'a' to 'd' caused by the presence of the drain pipe system can be prevented; the insides of the machine chamber and the exposure chamber are chemically cleaner, and thus occurrence of problems such as the illuminance reduction due to tarnish of the optical elements can be effectively suppressed for a even longer period of time.

According to the second aspect of this invention, there is provided a second exposure apparatus, comprising: an exposure apparatus main body that transfers a predetermined pattern onto the substrate; an exposure chamber that houses at least a part of the exposure apparatus main body, and in which the environmental conditions are kept substantially constant; a machine chamber connected to the exposure chamber via a supply path and via an exhaust path; an air conditioner arranged in the machine chamber that includes a cooler to cool gas for air conditioning circulating within the machine chamber and that performs air conditioning inside the exposure chamber; and a controller that controls the surface temperature of the cooler so that condensation does not occur.

According to this, since the controller controls the surface temperature of the cooler to a temperature where condensation does not occur, the drain pipe system of the air conditioner is not needed. Accordingly, occurrence of problems such as the foregoing 'a' to 'd' caused by the presence of the drain pipe system can be prevented; the insides of the machine chamber and the exposure chamber are chemically cleaner, and thus occurrence of problems such as the illuminance reduction due to tarnish of the optical elements can be effectively suppressed for a longer period of time. Therefore, highly accurate exposure quantity control and thus highly accurate exposure can be performed for a long period of time; increase of the exposure time due to the illumination reduction is effectively suppressed to maintain high throughput for a long period of time, and thus the productivity of micro-devices can be improved.

In the second exposure apparatus according to the present invention, the air conditioner may further include a heater that is arranged in the machine chamber and that heats the cooled gas. In such a case, the temperature of the air-conditioning gas can be easily adjusted to a desired temperature by heating the gas, which has been cooled by the cooler, by the heater.

The second exposure apparatus according to the present invention may further comprise a drain pan arranged below the cooler in a direction of gravity. In such a case, when controlling the surface temperature of the cooler becomes difficult due to occurrence of some problem in the cooler, the controller or the like, some measures are available.

According to the third aspect of this invention, there is provided a third exposure apparatus, comprising: an exposure apparatus main body that transfers a pattern formed on a mask onto a substrate; an exposure chamber that houses the exposure apparatus main body; and another chamber constituting an environmental control chamber separate from the exposure chamber and arranged on a side of the exposure chamber, wherein a blow port of gas for air conditioning supplied into the exposure chamber is provided in a boundary area between the exposure chamber and said another chamber.

According to this, since a blow port of gas for air conditioning supplied into the exposure chamber is made in a boundary area with the exposure chamber in another chamber, maintenance of the exposure apparatus main body in the exposure chamber can be performed from three sides other than a side, where the blow port is made, among the four sides (front, rear, right and left) of the exposure chamber. Accordingly, working efficiency of maintenance improves to shorten the time required for the maintenance, which can shorten the down time of the apparatus due to the maintenance. Furthermore, since the inside of the exposure chamber is air-conditioned by the gas for air conditioning blown from the blow port made in a boundary area with said another chamber, for example, in the upper half portion of the exposure chamber, there is no need to provide a filter for removing dust (air filter), a chemical filter and the plenum duct of the filter for removing dust on the ceiling of the exposure chamber. Therefore, according to the third exposure apparatus of the present invention, the cost of the clean room can be reduced because the total height of the apparatus can be lowered while securing good maintenance performance. Thus, the productivity of micro-devices can be improved due to improvement of the processing capacity in the long term and reduction of the equipment cost.

In the third exposure apparatus of the present invention, the inside of the exposure chamber may be air-conditioned in the down-flow manner using the gas for air conditioning blown from the blow port provided in the boundary area, or the upper space of the exposure chamber may have the gas blown into it in the side-flow manner.

The third exposure apparatus according to the present invention may further comprise a mask transportation system housed in said another chamber, which transports a mask into the exposure apparatus main body and transports the mask from the exposure apparatus main body.

Incidentally, in recent years there has been a demand for substrates (e.g., wafers in the manufacturing of semiconductor devices) of a larger size for the purpose of improving the productivity. The substrate side inclines to become large compared to the mask side, and in an exposure apparatus the substrate transportation system inclines to become larger than the mask transportation system. The third exposure apparatus according to the present invention was made to deal with this point as well.

The third exposure apparatus according to the present invention may further comprise an air filter to remove particles, which is arranged on the side of the blown port opposite said another chamber. As described, the substrate transportation system inclines to be relatively larger than the mask transportation system. Accordingly, since a mask transportation system housing chamber (said another chamber) has empty space to spare larger than that of a substrate transportation system housing chamber, an air filter can be arranged therein easily. In this case, with the air filter, a filter plenum (a chamber behind the filter for converting the dynamic pressure of sent gas into static pressure and blowing the gas uniformly) may be arranged. By this, uniform air-flow can be obtained from the blow port.

The third exposure apparatus according to the present invention may further comprise a chemical substance removing filter arranged in the exhaust path of the gas for air conditioning that returns from the exposure chamber to an air conditioner for the exposure chamber. In such a case, since the apparatus comprises the chemical substance removing filter arranged in the exhaust path of the gas for air conditioning that returns from the exposure chamber to its air conditioner, the chemical substance removing filter can substantially securely remove contaminants outgassed in the exposure apparatus main body, and thus the inside of the exposure chamber can be kept highly, chemically clean. Accordingly, occurrence of problems such as the illuminance reduction due to tarnish of the optical elements can be effectively suppressed for a longer period of time.

In this case, the air conditioner may include a cooler that cools the gas for air conditioning, and the exposure apparatus may further comprise a controller that controls the surface temperature of the cooler so that condensation does not occur. In such a case, the controller controls the surface temperature of the cooler to a temperature where condensation does not occur. Accordingly, the drain pipe system of the air conditioner is not needed, and occurrence of problems such as the foregoing 'a' to 'd' caused by the presence of the drain pipe system can be prevented. As a result, the inside of the exposure chamber is chemically cleaner, and thus occurrence of problems such as the illuminance reduction due to tarnish of the optical elements can be effectively suppressed for a longer period of time.

In the third exposure apparatus according to the present invention, supply paths and exhaust paths are constructed and arranged for the exposure chamber and said another chamber such that air conditioning thereof is performed by the same air conditioner. In such a case, each chamber can be air conditioned efficiently using only a single air conditioner.

In the first to third exposure apparatuses according to the present invention, the exposure apparatus main body may include a substrate stage that holds the substrate and an interferometer that measures a position of the substrate stage, and the exposure apparatus may further comprise another air conditioner that performs air conditioning of a part of the space inside the exposure chamber, where the substrate stage and the interferometer are arranged, independently of the air conditioner. In such a case, using an air conditioner having high temperature controllability as said another air conditioner limits measurement error of the interferometer caused by a so-called air fluctuation (temperature fluctuation) as small as possible, and positional control of the substrate stage, which requires accuracy particularly, can be performed with required accuracy.

In this case, said another air conditioner may be separate from the air conditioner, but, not being limited to this, may share a part of the air conditioner.

In the first to third exposure apparatuses according to the present invention, a surface of said substrate may be coated with a chemically amplified resist as a photosensitive agent. In such a case, since the inside of the exposure chamber can be kept chemically clean, the illumination reduction due to tarnish of the optical elements can be suppressed for a long period of time, and additionally, generation of the hardly-soluble surface layer of the chemically amplified resist can be limited.

Further, performing exposure in the lithography process by using any of the first to third exposure apparatuses according to the present invention improves the productivity of highly integrated devices in terms of at least any one of the capability of maintaining chemical cleanliness of the atmosphere inside the apparatus, improvement of the processing capacity in the long term, and reduction of the equipment cost. Therefore, according to the fourth aspect of this present invention, there is provided the device manufacturing method using an exposure apparatus of the present invention.

According to the fifth aspect of this invention, there is provided a first environmental control method of an exposure apparatus that supplies gas at least the temperature of which is controlled into an exposure chamber that houses at least a part of an exposure apparatus main body such that environmental conditions are kept substantially constant inside said exposure chamber, said exposure apparatus main body transferring a predetermined pattern onto a substrate, wherein chemical impurities in said gas are removed in an exhaust path from said exposure chamber, and at least part of said gas from which said chemical impurities have been removed is supplied into said exposure chamber via a chemical substance removing filter.

According to this method, chemical impurities in gas are removed in the exhaust path from the exposure chamber, and at least part of the gas from which the chemical impurities have been removed is supplied through a chemical substance removing filter into the exposure chamber again. Thus, the inside of the exposure chamber can be kept highly, chemically clean, and thus occurrence of problems such as the illumination reduction due to tarnish of the optical elements can be effectively limited for a long period of time. Therefore, highly accurate exposure quantity control and thus highly accurate exposure can be performed for a long period of time; increase of exposure time due to the illumination reduction is effectively limited to maintain high throughput for a long period of time, and as a result, the productivity of micro-devices can be improved.

In the first environmental control method according to the present invention, the surface temperature of a cooler for the gas may be set at such a temperature that condensation does not occur. In such a case, since the surface temperature of the cooler is set at a temperature where condensation does not occur, the drain pipe system of the cooler is not needed. Accordingly, occurrence of problems such as the foregoing 'a' to 'd' caused by the presence of the drain pipe system can be prevented; the insides of the exposure chamber are chemically cleaner, and thus occurrence of problems such as the illuminance reduction due to tarnish of the optical elements can be effectively suppressed for a longer period of time.

According to the sixth aspect of this invention, there is provided a second environmental control method of the exposure apparatus that supplies gas at least the temperature of which is controlled into an exposure chamber that houses at least a part of the exposure apparatus main body such that environmental conditions are kept substantially constant inside the exposure chamber, the exposure apparatus main body transferring a predetermined pattern onto a substrate, wherein the gas is made to pass though a cooler before supplying the gas into the exposure chamber and the surface temperature of the cooler is set at such a temperature that condensation does not occur.

According to this, the gas passes through the cooler before being supplied into the exposure chamber, and the surface temperature of the cooler is set at a temperature where condensation does not occur. Therefore, the drainpipe system of the cooler is not needed, and occurrence of problems such as the foregoing 'a' to 'd' caused by the presence of the drain pipe system can be prevented. Accordingly, the insides of the exposure chamber are chemically cleaner, and thus occurrence of problems such as the illuminance reduction due to tarnish of the optical elements can be effectively suppressed for a longer period of time. Therefore, highly accurate exposure quantity control and thus highly accurate exposure can be performed for a long period of time; increase of exposure time due to the illumination reduction is effectively limited to maintain high throughput for a long period of time, and as a result, the productivity of microdevices can be improved.

According to the seventh aspect of this invention, there is provided an exposure apparatus, comprising: an exposure apparatus main body that transfers a predetermined pattern onto a substrate; a substrate transportation system that transports the substrate to the exposure apparatus main body; a first chamber that houses at least a part of the exposure apparatus main body and in which environmental conditions are kept substantially constant; a first return duct an end of which is connected to the first chamber and through which gas exhausted from the first chamber passes; a second chamber that houses at least a part of the substrate transportation system, and in which environmental conditions are kept substantially constant; a second return duct an end of which is connected to the second chamber and through which gas exhausted from the second chamber passes; and a first chemical substance removing filter that is connected to another end than the end of the first return duct and to another end than the end of the second return duct and that removes chemical impurities in both of gas exhausted from the first chamber and gas exhausted from the second chamber.

BRIEF DESCRIPTION OF THE DRAWINGS

In the accompanying drawings.

DETAILED DESCRIPTION OF THE PREFERRED EMBODIMENTS

<<Exposure Apparatus>>

Figure 1:
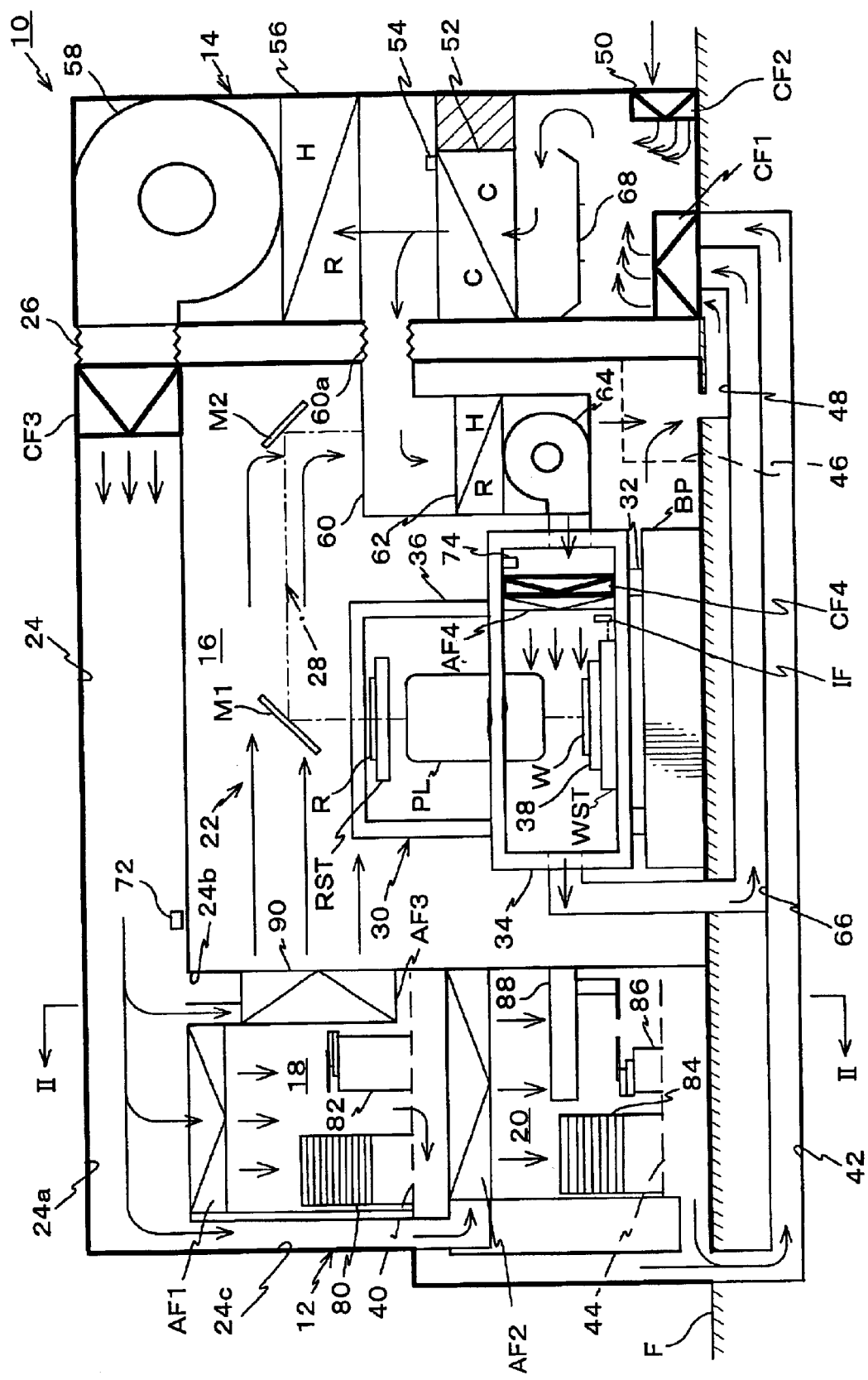
FIG. 1 is a view schematically showing the entire structure and arrangement of the exposure apparatus according to a first embodiment of the present invention.
Figure 2:
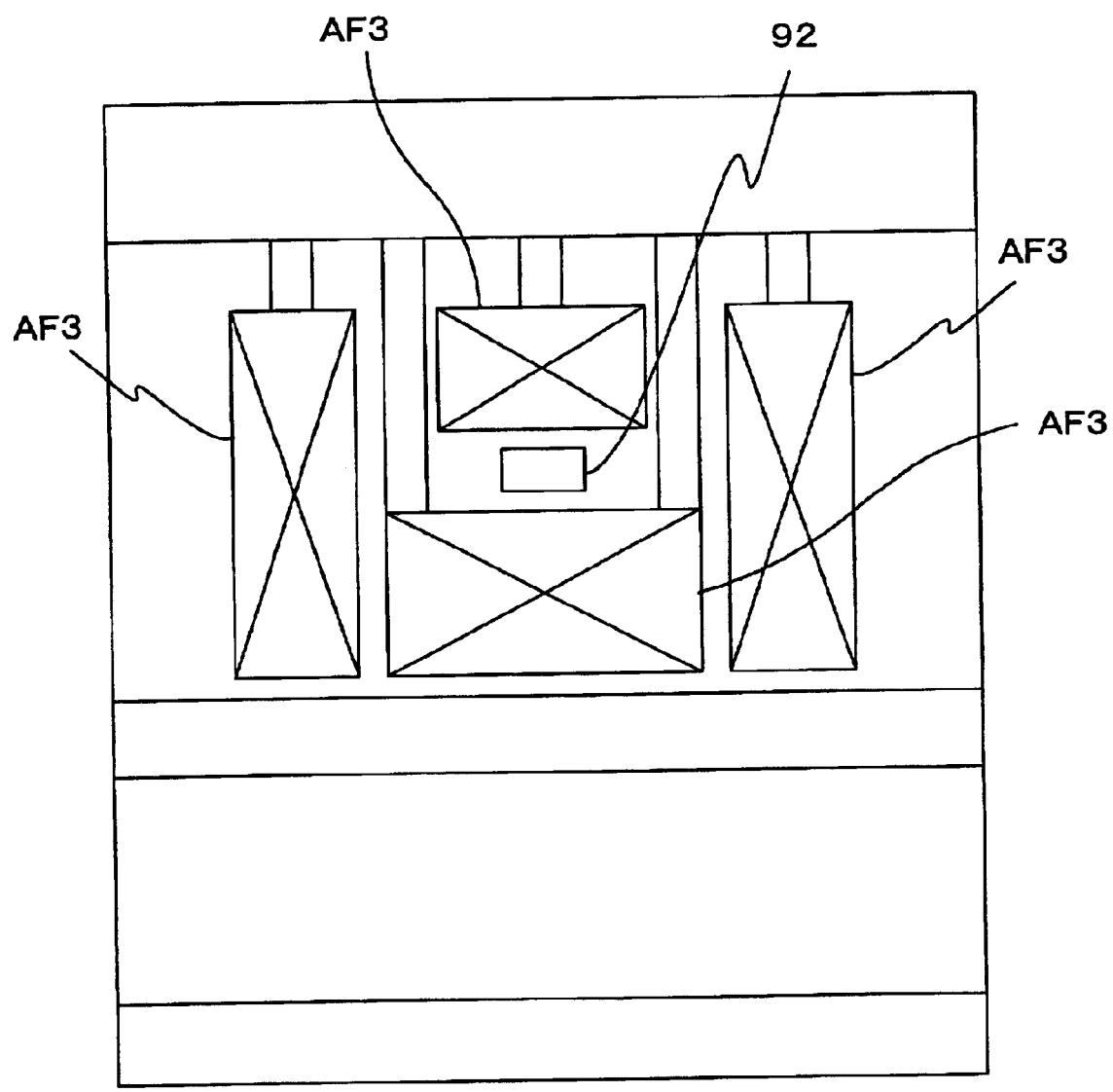
FIG. 2 is a cross-sectional view on the II—II line of FIG. 1.

The first embodiment of the present invention will be described with reference to FIG. 1 to FIG. 3 as follows. FIG. 1 schematically shows the entire constitution of an exposure apparatus 10 according to the first embodiment.

The exposure apparatus 10 comprises: a main body chamber 12 installed on a floor F in the clean room; and a machine chamber 14 arranged adjacent to the main body chamber 12.

Environmental conditions (cleanliness, temperature, pressure, humidity and the like) inside the main body chamber 12 is maintained substantially constant, and one large chamber 16 closer to the machine chamber 14 and two small chambers (18 and 20) arranged vertically on the opposite side of the large chamber 16 from the machine chamber 14 are provided. Among these chambers, the large chamber 16 is the exposure chamber that houses an exposure apparatus main body 22 inside thereof. Hereinafter, the large chamber 16 is called an exposure chamber 16.

In the small chamber 18, a reticle library 80 holding a plurality of reticles as masks and a reticle loader 82 constituted by a horizontal multi-joint robot are sequentially arranged from the side further from the exposure chamber 16. A reticle R is transported onto and from a reticle stage RST (described later) that forms part of the exposure apparatus main body 22 by the reticle loader 82. In this embodiment, the reticle library 80 and the reticle loader 82 constitute a reticle loader system as the mask transportation system, and the reticle loader system is housed in the small chamber 18. That is, the small chamber 18 constitutes the mask transportation system housing chamber, which houses the reticle loader system as the mask transportation system. Hereinafter, the small chamber 18 will be referred to as a reticle loader chamber 18.

Note that the reticle loader system as the mask transportation system is not limited to the foregoing constitution. For example, a closed cassette of a bottom-open type (a container) that can house a plurality of the reticles may be used instead of the reticle library 80, or a mechanism of sliding a transportation arm can be used as the reticle loader. Furthermore, a reticle storing section (the reticle library 80) and the reticle loader 82 may be severally arranged in different chambers, or the bottom of the foregoing closed cassette mounted on the top of the reticle loader chamber 18 may be opened so that a reticle can be transported into the reticle loader chamber 18 in an airtight manner. In short, only the reticle loader may be arranged in the small chamber 18.

Further, the other small chamber 20 houses a wafer carrier 84 that stores a plurality of wafers as substrates, a horizontal multi-joint robot 86 that carries the wafer into/from the wafer carrier 84, and a wafer transportation unit 88 that transports the wafer between the robot 86 and a wafer stage WST constituting the exposure apparatus main body 22. In this embodiment, the wafer carrier 84, the robot 86 and the wafer transportation unit 88 constitute a wafer loader system as a substrate transportation system, and the wafer loader system is housed in the small chamber 20. That is, the small chamber 20 constitutes the substrate transportation system housing chamber that houses the wafer loader system as the substrate transportation system. Hereinafter, the small chamber 20 will be referred to as a wafer loader chamber 20 for convenience.

Note that the wafer loader system as the substrate transportation system is not limited to the foregoing constitution. For example, only the multi-joint robot may constitute the wafer loader system, or only the wafer loader may be arranged inside the wafer loader chamber 20.

Figure 6:
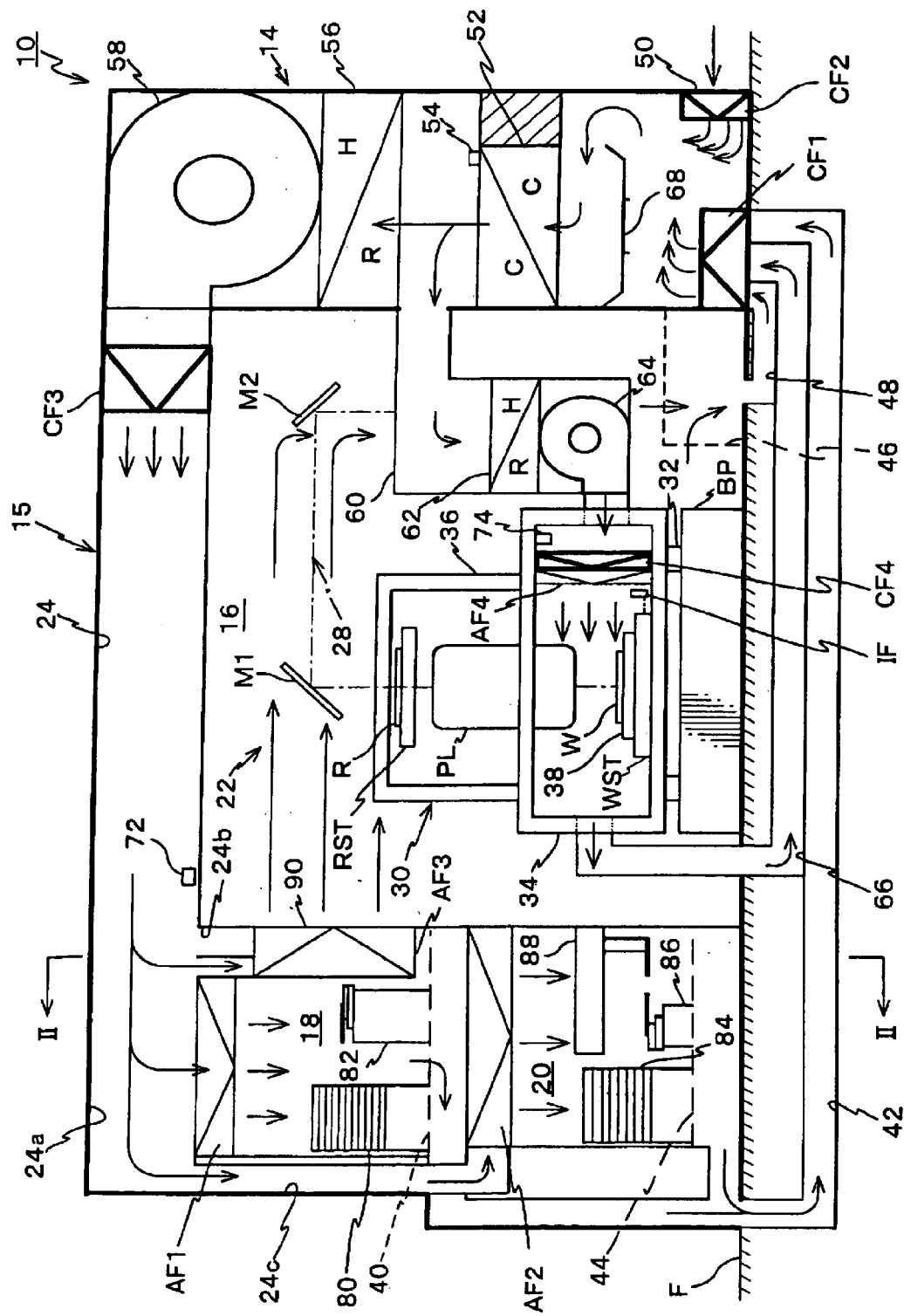
FIG. 6 is a view schematically showing the entire structure and arrangement of the exposure apparatus.

Each of the exposure chamber 16, the reticle loader chamber 18 and The wafer loader chamber 20 is connected to the machine chamber 14 via a supply duct 24, which is made of a material emitting less Lass such as stainless steel (SUS), Teflon (a registered trademark) or the like, and a connection limit 26 connected to the opposite end portion of the supply duct 24 from the exposure chamber 16, the reticle loader chamber 18 and the wafer loader chamber 20. The connection unit 26 is detachable at least from the supply duct 24 (main body chamber 12), and is constituted by an expandable and contractible bellows-like member in this case. Accordingly in this embodiment, vibration generated by the blower constituting the air conditioner (described later) housed inside the machine chamber 14 is absorbed by expansion of the connection unit 26, and influence that the vibration gives to the main body chamber 12 is efficiently reduced. Note that the supply duct 24 and the connection unit 26 constitute the supply path in this embodiment. In addition, the machine chamber 14 may be formed with the exposure chamber 16 in a same chamber 15 as shown in FIG. 6.

Note that a flow path (including the connection unit 26) in the upstream of a chemical filter CF3 may also be constituted of the material emitting less gass to lengthen the life of the chemical filter CF3 and the like.

The exposure apparatus main body 22 housed in the exposure chamber 16 comprises an illumination optical system 28 including mirrors M1 and M2; a projection optical system PL arranged below the illumination optical system 28; the reticle stage RST that holds a reticle R as a mask and that is arranged between the projection optical system PL and the illumination optical system 28; the wafer stage WST that holds a wafer W as a substrate and that is arranged underneath the projection optical system PL; a main body column 30 that holds the projection optical system PL and on which the wafer stage WST is mounted; and the like.

The illumination optical system 28 includes an optical integrator, an aperture stop (both are not shown) and the like, as well as the mirrors M1 and M2, which are arranged in a predetermined positional relation in an illumination system housing (not shown). The illumination optical system of the same constitution as the illumination optical system is disclosed in Japanese Patent Laid-Open No. 1-259533 and the U.S. Pat. No. 5,307,207 corresponding thereto and the like, and the disclosure of the foregoing United States Patent is fully incorporated herein by reference. The illumination optical system 28 is connected to the excimer laser such as the KrF excimer laser (output wavelength of 248 nm) or the ArF excimer laser (output wavelength of 193 nm) as the light source (not shown) via a guidance optical system (a relay optical system, not shown). The guidance optical system includes an optical system, which is called a beam-matching unit, for adjusting the optical axis of the light source to that of the illumination optical system 28 as at least a part thereof. The inside of the illumination system housing (not shown) that houses the illumination optical system 28 and the inside of a body (a mirror barrel) that is arranged between the light source (the excimer laser in this embodiment) and the illumination optical system 28 and that houses the guidance optical system including the beam-matching unit as at least a part, is severally purged by inert gas (nitrogen, helium or the like, for example), and thus the cleanliness is kept extremely high.

Note that at least a part of the illumination optical system 28 may be arranged outside the exposure chamber 16, and/or that some of the other members (the wafer stage WST, for example) than the light source, the guidance optical system, and the illumination optical system 28 may be arranged in a body different from the exposure chamber. In this case, the foregoing different case may be arranged in the exposure chamber or may be arranged outside the exposure chamber. In short, at least a part of the exposure apparatus main body needs to be arranged inside the exposure chamber 16, and there is no limitation on selection of members arranged inside the exposure chamber 16 and the arrangement and construction thereof.

The main body column 30 is supported above a base plate BP installed on the bottom surface of the main body chamber 12 via a plurality of anti-vibration blocks 32. The main body column 30 includes: a main column 34 supported by the anti-vibration blocks 32; and a support column 36 provided on the main column 34. The projection optical system PL is held on a main frame that constitutes the ceiling surface of the main column 34 via a supporting member called a first Invar (not shown). In this case, the optical axis of the projection optical system PL is parallel to the vertical direction. Herein, as the projection optical system PL, a reduction optical system having the projection ratio of ¼ or ⅕ is used. The support column 36 supports at least a part of the illumination housing (not shown) from below.

The wafer stage WST is driven on a stage base constituting the bottom plate of the main column 34 in two dimensions by a planar motor, a linear motor or the like (not shown). The wafer W is fixed via a wafer holder 38 on the upper surface of the wafer stage WST by vacuum chuck or the like. The position of the wafer stage WST in an XY plane and a rotation quantity (at least one of a yawing quantity, a pitching quantity and a rolling quantity) are measured by a laser interferometer IF with are solving power of, for example, about 0.5 to 1 nm via a movable mirror (not shown) provided on the wafer stage WST.

The reticle stage RST is mounted on a reticle stage base constituting the ceiling portion of a supporting member (not shown) that is called a second Invar and that is provided on the upper surface of the main column 34. The reticle stage RST is constituted so as to be able to be finely driven on a horizontal plane when the exposure apparatus main body 22 is of a stationary exposure type disclosed in, for example, Japanese Patent Laid-Open No. 5-21314 and the U.S. Pat. No. 5,243,195 corresponding thereto. Further, the reticle stage RST is constituted so as to also be able to be moved in a predetermined stroke in a predetermined scanning direction when the exposure apparatus main body 22 is of a scanning exposure type disclosed in, for example, Japanese Patent Laid-Open No. 4-196513 and the U.S. Pat. No. 5,473,410 corresponding thereto. And the disclosures of the foregoing United States Patents are fully incorporated herein by reference.

According to the exposure apparatus main body 22 constituted in this manner, after a pulse ultraviolet light emitted from the excimer laser (not shown) is shaped into a necessary shape and made uniform in its illuminance by the illumination optical system 28 that consists of various kinds of lenses, mirrors and the like, the light illuminates the reticle R on which a predetermined pattern is formed. By this, the pattern formed on the reticle R is reduced and transferred onto each shot area on the wafer W held on the wafer stage WST via the projection optical system PL.

In this embodiment, a wafer whose surface is coated with a positive-type, chemically amplified resist as photosensitive material is used as the wafer W.

The chemical filter CF3 as the chemical material removing filter is arranged at one end (end portion closer to the machine chamber 14) of the supply duct 24 in the main body chamber 12. The other end of the supply duct 24 is divided into two, and one divided path 24a is connected to the reticle loader chamber 18. A filter box AF1 that consists of a ULPA filter (ultra low penetration air-filter), which removes particles in air flowing into the reticle loader chamber 18, and a filter plenum is provided at the blow port of the reticle loader chamber 18 for air as gas for air conditioning. Furthermore, a return section 40 is provided on the side of the reticle loader chamber 18 opposite to the filter box AF1. One end of a return duct 42 as an exhaust path is connected to the return section 40, and the other end of the return duct 42 is connected to part of the bottom surface of the machine chamber 14.

Another divided path 24c is provided to the divided path 24a at its far end portion, and the divided path 24c is connected to the wafer loader chamber 20. And a filter box AF2 that consists of the ULPA filter, which removes particles in air flowing into the reticle loader chamber 20, and the filter plenum is provided at the blow port of air of the wafer loader chamber 20. In addition, a return section 44 is provided on the side of the wafer loader chamber 20 opposite to the filter box AF2. An exit hole in communication with the return duct 42 is provided on the opposite side of the return section 44 from the wafer loader chamber 20.

Furthermore, another divided path 24b is connected to a filter box AF3 arranged on the side of a blow port 90 close to the reticle loader chamber 18, which port is made in the portion of the exposure chamber 16 facing the reticle loader chamber 18. The filter box AF3 consists of the ULPA filter, which removes particles in air flowing into the exposure chamber 16, and the filter plenum. And a uniform airflow is sent sideways into the upper space of the exposure chamber 16 through the blow port 90. In the boundary area (division wall) between the reticle loader 18 and the exposure chamber 16, where the blow port 90 is made, a plurality of the filter boxes AF3 are arranged around a reticle transportation area 92, as shown in FIG. 2, a cross-sectional view on the II—II line of FIG. 1.

A return section 46 is provided on the side of the bottom of the exposure chamber 16 close to the machine chamber 14 as shown in FIG. 1; an exhaust port in communication with one end of a return duct 48 as an exhaust path is made in the bottom wall of the main body chamber 12 and under the return section 46, and the other end of the return duct 48 is connected to part of the bottom surface of the machine chamber 14.

An OA port 50 as an outside air intake is made in the opposite lower wall of the machine chamber 14 from the main body chamber 12, and a chemical filter CF2 as a chemical material removing filter is arranged opposite the OA port 50.

The inside of the main body chamber 12, particularly the inside of the exposure chamber 16, is always kept in the higher pressure than the outside to maintain cleanliness. Accordingly, air leaks through the front surface of the main body chamber 12, an in-line interface (not shown) and the like to the outside. The OA port 50 is provided to take in outside air and make up for the amount lost. Furthermore, in this embodiment, for the purpose of providing a countermeasure to a so-called T-shape of the chemically amplified resist and the like, the chemical filter CF2 is provided at the OA port 50 to take only clean air into the exposure apparatus by removing the chemical material (impurity) in air taken into the exposure apparatus.

A cooler (a dry coil) 52 as a cooling unit is provided slightly below the center of the inside of the machine chamber 14 in a height direction of the machine chamber 14. A first temperature sensor 54 that detects the temperature of the surface of the cooler is arranged in the exit area of the cooler 52. A detection value of the first temperature sensor 54 is supplied to a controller 70 (not shown in FIG. 1; refer to FIG. 3).

A first heater 56 as a heating unit is arranged a predetermined distance above the cooler 52 of the air path in the machine chamber. A first blower 58 is arranged at the exit area of the machine chamber 14 above the first heater 56. In this case, the cooler 52, the first heater 56 and the first blower 58 constitute a first air conditioner.

Furthermore, a path 60 is provided below the first heater 56, an air path, of the machine chamber 14, into which about ⅓ of the air that has passed through the cooler 52 upward flows. The end portion of the path 60 opposite the machine chamber 14 is constituted by an expandable and contractable bellows-like member 60a. In this case similarly to the foregoing, influence that the vibration of the machine chamber 14 has on the exposure chamber main body 12 can be efficiently reduced by the bellows-like member 60a.

Part of the path 60 on the opposite side of the bellows-like member 60a from the machine chamber 14 is arranged in the exposure chamber 16. A second heater 62 as a heating unit and a second blower 64 are sequentially arranged in the path 60. In this case, the cooler 52, the second heater 62 and the second blower constitute a second air conditioner. Herein, although the second blower 64 is arranged in the exposure chamber 16, its vibration hardly causes any problem because the second blower is a small blower having a blow amount of about ¼ of the first blower's.

A blow port of air toward the vicinity of the wafer stage WST is provided on the opposite side of the second blower 64 from the machine chamber 14, and a chemical filter CF4 and a filter box AF4 that consists of the ULPA filter and the filter plenum are arranged at the blow port area. An open end of a return duct 66 as an exhaust path is arranged in an area of the exposure chamber 16 opposite the wafer loader chamber 20, opposite to the ejection port provided with the chemical filter CF4 and the filter box AF4, and the other end of the return duct 66 is connected to part of the bottom surface of the machine chamber 14.

An opening is made in part of the bottom of the machine chamber 14 to which the three return ducts 42, 48, 66 are connected and a chemical filter CF1 as a chemical material removing filter is provided opposite the opening. The chemical filter CF1 can be attached/detached easily via an open/close door (not shown) provided in the machine chamber 14.

The chemical filters CF1, CF2, CF3, CF4 used in this embodiment are one that remove plasticizer, fire retardant and other chemical impurities as well as an organic material of silicon series such as siloxiane and silazane, hydrocarbon, and basic gas such as ammonia gas, which are present in the clean room. Specifically, activated carbon (Gigasoap manufactured by Nitta Corporation, for example) or Zeolite filter are used as the chemical filters CF1, CF2, CF3, CF4.

Furthermore, a drain pan 68 is arranged below the cooler 52 in the machine chamber 14. However, the drain pan 68 is not connected with any pipe system. The reason for this will be described later.

A second temperature sensor 72 that detects the temperature of air inside the supply duct 24 is arranged on the side, closer to the machine chamber 14, of the fork portion of the supply duct 24 in the main body chamber 12. Detection values of the second temperature sensor 72 are supplied to the controller 70 (not shown in FIG. 1; refer to FIG. 3).

A third temperature sensor 74 that detects the temperature of air supplied from the second blower 64 is arranged in the upstream of the chemical filter CF4. Detection values of the third temperature sensor 74 are supplied to the controller 70 (not shown in FIG. 1; refer to FIG. 3).

Figure 3:
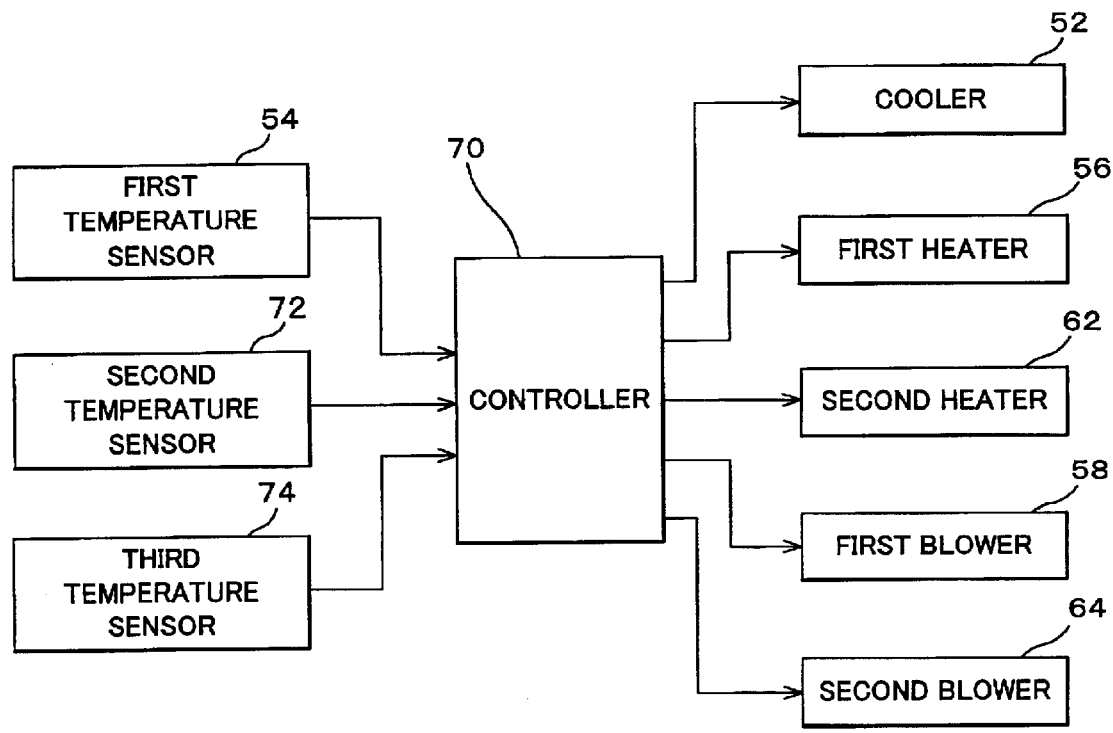
FIG. 3 is a block diagram showing a control system related to the temperature control of gas for air conditioning in the exposure apparatus of FIG. 1.

FIG. 3 schematically shows the structure of a control system regarding the temperature control of the gas for air conditioning. The control system includes the controller 70 constituted by a microcomputer (or a workstation) as the main component.

Next, description will be made of the air conditioning in the exposure apparatus having the structure as described above.

Firstly, the controller 70 activates the first and second blowers (58 and 64), which send air severally into the reticle loader chamber 18, the wafer loader chamber 20, the exposure chamber 16 and the vicinity of the wafer stage WST in the exposure chamber 16 via the filter boxes (AF1, AF2, AF3 and AF4) respectively so that air conditioning of each part is performed. In this case, air conditioning is performed in a down-flow manner in the reticle loader chamber 18 and the wafer loader chamber 20. Further, air conditioning of each section of exposure apparatus main body 22 during the foregoing exposure operation is performed in a side-flow manner. Then, air returned to the return duct 42 via the return section 40 and 44, air returned to the return duct 48 via the return section 46, and air returned to the return duct 66 pass through the chemical filter CF1 provided in the exit area of those return ducts on the machine chamber 14 (an entrance of the machine chamber 14 in this embodiment). The chemical impurities contained in air in each return duct as described above are adsorbed and removed by the chemical filter CF1 while the air passes through the chemical filter CF1.

And then, chemically clean air that has passed through the chemical filter CF1 and air that has been taken in via the OA port from the outside of the apparatus and that has passed through the chemical filter CF2 join, and then are cooled down to a predetermined temperature by the cooler 52 that forms part of the first and second air conditioners. In this case, in this embodiment, the controller 70 controls a cooling operation of the cooler 52 while monitoring the output of the first temperature sensor 54, and at this point, air passing through the cooler is cooled down to, for example, a little higher than 5° C. or approximately 15° C. so that condensation of moisture does not occur on the cooler's surfaces in the humidity and the pressure of the air. As described, since condensation does not occur on the surfaces of the cooler 52, no drain-pipe system is provided in this embodiment. However, a failure of the first temperature sensor 54 or some problem of the cooler 52 may occur which could make the foregoing surface temperature control of the cooler 52 difficult. Therefore, the drain pan 68 is provided in this embodiment just in case such emergency occurs.

About 80% of the air cooled down to the predetermined temperature and having passed through the cooler 52 is sent to the first heater 56; the rest, about 20%, is sent to the second heater 62 in the path 60, and they are heated to respective target temperatures. In this case, the controller 70 performs the feedback control of the first heater 56 based on detection values of the second temperature sensor 72, and also performs the feedback control of the second heater 62 based on detection values of the third temperature sensor 74. In this case, the target temperature (or the temperature control range) of air blown off into the exposure chamber 16 and the like via the supply duct 24 and the target temperature (or the temperature control range) of air blown toward the vicinity of the wafer stage WST via the path 60 can be set individually.

Then, two portions of chemically very clean air heated to respective target temperatures by the first and second heaters 56, 62 are sent into the chemical filters CF3, CF4 by the first and second blowers 58, 64 respectively. The air having passed through the chemical filter CF3 and the supply duct 24 of the main body chamber 12 is divided and sent into the reticle loader chamber 18, the wafer loader chamber 20 and the exposure chamber 16 via the filter boxes AF1, AF2, AF3 respectively. Further, the air having passed the chemical filter CF4 passes through the filter box AF4 and is sent to the vicinity of the wafer stage WST.

Since particles in air are almost certainly removed when the air passes through the ULPA filters in the filter boxes AF1, AF2, AF3, AF4, the air that is highly clean without containing particles and particulates such as the chemical impurities is supplied to the reticle loader chamber 18, the wafer loader chamber 20, the exposure chamber 16 and the vicinity of the wafer stage WST, and air conditioning is performed of the reticle loader system, the wafer loader system and the exposure apparatus main body 22 using the clean air. After the air conditioning, chemically contaminated air containing chemical impurities in gas emitted from the exposure apparatus main body 22 and the like is returned to the return ducts 42, 48, 66, and after that, the above air conditioning of each section is continued.

As described above, according to this embodiment, since the chemical filter CF1 as a chemical material removing filter is arranged in the exit area, on the machine chamber 14, of the return ducts 42, 48, 66 as the exhaust paths returning to the machine chamber from the main body chamber 12, the chemical filter CF1 can almost certainly remove the chemical contaminants in gas emitted from the exposure apparatus main body 22, the reticle loader system, the wafer loader system and the like.

Further, the chemical filter CF1 is arranged in the exit area on the machine chamber 14 (an entrance area of the machine chamber 14) in the exhaust path returning to the machine chamber from the main body chamber 12, and because the open/close door (not shown) is provided in this area, replacement of the chemical filter CF1 can be easily performed through the open/close door. Accordingly, the down time of the apparatus due to replacement of the chemical filter CF1 shortens, and the processing capacity can be improved in the long term.

Note that although in this embodiment the chemical filter CF1 is arranged in the exit area of the exhaust path on the machine chamber 14, not being limited to this, the filter may be arranged anywhere in the exhaust path. Moreover, an individual chemical filter may be arranged in each return duct 42, 48, 66. However, it is desirable that the filter be installed in a position where replacement thereof is easy. Furthermore, all flow-paths including the supply path and the exhaust path, in which gas for air conditioning flows, and members (or their surfaces) that exist on the flow paths and that contact the gas for air conditioning may be made of material emitting less gas. Even further, the gas for air conditioning may be gas other than air, and such gas needs to be introduced into the exposure apparatus from a supply source after passing through a chemical filter (corresponding to the chemical filter CF2 of FIG. 1).

In this embodiment, because the machine chamber 14 is provided with the OA port 50, and the chemical filter CF2 as a chemical material removing filter is provided inside the OA port 50, chemically clean air is taken into the apparatus as a result, and the cleanliness inside the apparatus is not reduced. Therefore, the inside of the main body chamber 12 can be kept highly clean while keeping the inside pressure higher than that of the outside.

Furthermore, in this embodiment, the chemical filter CF3 as a chemical material removing filter is disposed in part of the supply path extending from the machine chamber 14 to the supply duct 24 of the main body chamber 12. Accordingly, before sending air the temperature of which has been adjusted by the air conditioner of the machine chamber 14 into the exposure chamber 16 housing the exposure apparatus main body 22, the chemical contaminants in the air can be removed. Thus, air conditioning of the exposure apparatus main body 22 can be performed using the highly, chemically clean air so that the inside of the main body chamber 12 is kept highly clean. Further, since the chemically clean air from which chemical contaminants have been removed by the chemical filters CF1, CF2, is sent to the chemical filter CF3, the lifetime thereof lengthens, and replacement is not required for a long period of time. However, since the chemical filter CF3 is arranged in the vicinity of the connection unit 26 between the machine chamber 14 and the supply duct 24 of the main body chamber 12, after moving the machine chamber 14 to remove the bellows-like connection unit 26, replacement of the chemical filter CF3 can be readily performed. Accordingly, the down time of the apparatus due to replacement of the chemical filter CF3 shortens, and the processing capacity can be improved in the long term.

In addition, the path 60 is provided in the air path inside the machine chamber 14, and air conditioning is performed of the vicinity of the wafer surface via the path 60 independently of the other sections. Therefore, the fluctuation of the air can be efficiently prevented from causing measurement errors in the measurement values of the interferometer IF, which measures the position of the wafer stage WST, and the position control of the wafer stage WST which particularly requires accuracy can be performed with required accuracy. Because the chemically clean air having passed through the chemical filter CF4 is used as air for air conditioning of the vicinity of the wafer surface, the phenomenon of the chemically amplified resist's surface becoming hardly soluble can be effectively prevented from occurring.

Similarly, because the chemically clean air is also supplied into the wafer loader chamber 20 where wafers are transported which are coated with the chemically amplified resist easily affected by chemical impurities, the phenomenon of the chemically amplified resist's surface becoming hardly soluble can be effectively prevented from occurring in this section as well.

Furthermore, the filter boxes each having a ULPA filter for removing particles are disposed near the air blow ports of the supply duct 24 in the main body chamber 12 for the exposure chamber 16, the reticle loader chamber 18 and the wafer loader chamber 20, and near the air blow port toward the wafer surface. Therefore, since the cleanliness inside the exposure apparatus can be kept at class about 1 even if the apparatus is installed in the clean room having cleanliness as low as class about 100 to 1000, the maintenance cost of the clean room can be reduced.

At least an inner wall area of the supply duct 24 in the downstream of the chemical filter CF3 is made up of the material with less degassing such as SUS or Teflon (registered trademark). Therefore, really chemically clean air can be sent into the exposure chamber 16 that houses the exposure apparatus main body 22, the reticle loader chamber 18 and the wafer loader chamber 20, because no gas is emitted from the supply duct in the downstream of the chemical filter CF3.

Furthermore, in this embodiment, since an activated carbon filter or a Zeolite filter is used as the chemical filters CF1 to CF4, almost all chemical impurities generated in the clean room and the exposure apparatus can be generally removed. Specifically, silicon-organic substances such as siloxane (a substance having an Si—O chain as the axis) and silazane (a substance having an Si—N chain as the axis) pose a problem, which exist in spaces between optical devices in the projection optical system and the illumination optical system. In more detail, a substance called "cyclic siloxane" whose Si—O chain forms a ring is contained in an adhesive agent, a sealing agent, paint and the like used in the projection exposure apparatus, and the substance is emitted as gas due to ageing. It is well known that the cyclic siloxane adheres to a surface of a semiconductor substrate such as a silicon wafer and a surface of a dielectric such as a lens, and that, when irradiated by ultraviolet light (UV light), the cyclic siloxane is oxidized to change into tarnish such as silicon oxide on the surfaces of the optical devices.

As silazane, there exists HMDS (hexamethyl-disilazane) having two pieces of Si, which is used as a pretreatment agent in a resist coating process by many users. The HMDS, only if reacting with water, changes (hydrolyzes) into a substance called silanol, which quite easily adheres to the surface of a semiconductor substrate or the surface of a dielectric. Furthermore, when irradiated by ultraviolet light (UV light), it is oxidized to change into tarnish such as silicon oxide on the surfaces of the optical devices similarly to siloxane. Note that hydrolysis generates ammonia from siloxane, and that the ammonia tarnishes the surfaces of the optical devices even further when it coexists with siloxane.

The chemical filter of this embodiment can remove the silicon-organic substances such as siloxane and silazane.

In the projection exposure apparatus that uses KrF excimer laser light, ArF excimer laser light and laser light having a shorter wavelength as exposure illumination light, so-called optical cleaning is generally performed in order to clean the surfaces of optical devices. Although organic substances (hydrocarbon) removed from the surfaces of the optical devices float in the air in the apparatus, the organic substances can also be removed by the chemical filters of this embodiment.

Currently, besides the silicon series impurities, a plasticizer (such as phthalate ester), a fire retardant (phosphoric acid and chlorine substance) and the like, which are emitted as gas from wiring, plastic and the like in the chamber, are posing problems as impurities. However, such plasticizer, fire retardant and the like can also be removed by the foregoing activated carbon filters.

In addition, in the exposure apparatus 10 of this embodiment, since the controller 70 controls the surface temperature of the cooler 52 to a temperature where condensation does not occur, the drain pipe system of the air conditioner is not necessary, and undesirable phenomenon such as the foregoing 'a' to 'd' caused by the presence of the drain pipe system can be prevented from occurring.

According to the exposure apparatus 10 of this embodiment, the various contrivances described above in detail can keep the inside of the machine chamber 14 and the main body chamber 12 chemically clean for a long period of time. Accordingly, occurrence of problems such as the illumination reduction due to tarnish of the optical elements can be suppressed for a long period of time, and additionally, the phenomenon of the chemically amplified resist's surface becoming hardly soluble can be effectively prevented from occurring. Therefore, highly accurate exposure quantity control and thus highly accurate exposure can be performed for a long period of time, and increase of exposure time due to the illumination reduction is effectively suppressed so that high throughput is maintained for a long period of time.

Moreover, in the exposure apparatus 10 of this embodiment, the blow port 90 of gas for air conditioning to blow air into the upper space in the exposure chamber 16 sideways is provided in the boundary area between the reticle loader chamber 18 and the exposure chamber 16. For this reason, maintenance of the exposure apparatus main body 22 in the exposure chamber 16 can be performed from three sides among the four sides (front, rear, right and left) of the exposure chamber 16 other than the side where the blow port 90 is provided (maintenance from the side opposite the machine chamber 14 can be performed by removing the machine chamber 14). Therefore, working efficiency of maintenance improves; the time required for the maintenance shortens, and thus the down time of the apparatus due to the maintenance can be shortened.

Furthermore, since air conditioning of the inside of the exposure chamber 16 is performed in the side-flow manner, there is no need to install a filter for removing dust (air filter)

or a chemical filter, and a plenum duct for the filter for removing dust on the ceiling of the exposure chamber 16. Note that although in FIG. 1 the supply duct 24 is above the illumination optical system 28 for the sake of convenience in drawing, the supply duct 24 can be arranged in an empty space beside the illumination optical system 28 because the supply duct 24 occupies not the entire area of the ceiling but a part thereof. With this arrangement, the total height of the apparatus can be greatly lowered comparing to the conventional exposure apparatus of the down-flow method. Thus, according to the exposure apparatus 10 of this embodiment, the total height of apparatus can be lowered while securing the good maintenance performance. This can reduce the equipment cost of the clean room.

Note that only the supply path may be provided at the ceiling part of the exposure chamber to perform the down-flow, and that the total height of apparatus can be lowered in this case as well.

As it is clear in the foregoing description, according to the exposure apparatus 10 of this embodiment, improvement in the capability of maintaining the chemical cleanliness of the atmosphere inside the apparatus, improvement of the processing capacity, and reduction of the equipment cost can be achieved. Therefore, the productivity of the exposure apparatus 10 in manufacturing micro-devices such as semiconductor devices (LSI's) and the like can be improved consequently in any aspect of the capability of maintaining the chemical cleanliness of the atmosphere inside the apparatus, the processing capacity, and the equipment cost.

Note that although, in the above embodiment, description has been made of the case where chemical filters are provided in the OA port area, the entrance area, of the supply path in the main body chamber, opposite the machine chamber and in the vicinity of the blow port of the air toward the wafer surfaces, as well as the chemical filter disposed at the end portion of the return duct on the machine chamber, the present invention is not limited to this. That is, when at least one chemical filter is provided in a position inside the return duct, the purpose of suppressing occurrence of problems such as the illumination reduction due to tarnish of the optical elements for a long period of time and thus improving the throughput and the productivity in manufacturing micro-devices can be achieved to a certain extent.

Furthermore, although, in the above embodiment, description has been made of the case where chemical filters are provided at the exit of the return ducts on the machine chamber and where the surface temperature of the cooler is controlled to a temperature where condensation does not occur, occurrence of problems such as the illumination reduction due to tarnish of the optical elements can be suppressed for a long period of time with either one of these means. Needless to say, the combination of the air conditioning mechanism and the paths shown in FIG. 1 is not indispensable, and any arrangement is possible.

Even further, although, in the above embodiment, description has been made of the case where the reticle loader chamber, the wafer loader chamber and the exposure chamber are provided in the main body chamber, the present invention is not limited to this, and only the exposure chamber may be provided in the main body chamber, and the reticle loader chamber and the wafer loader chamber may be provided in another environment-control chamber together or individually in other environment-control chambers.

In the foregoing embodiment, description has been made of the case where the machine chamber and the main body chamber are separate, but the invention is not limited to this, and one chamber may be divided by a wall into the exposure chamber to house the exposure apparatus main body and the machine chamber.

Note that the machine chamber is arranged adjacent to the main body chamber in FIG. 1, but the machine chamber may be arranged under the floor of the clean room (a utility space) or the like. The light source also may be arranged under the floor in this case. In the above embodiment the air conditioner controls the air temperature, but it may also control at least one of humidity and pressure.

In a case where ArF excimer laser light (a wavelength of 193 nm) is used as the illumination light for exposure, inert gas (such as nitrogen) is supplied into the mirror barrel of the projection optical system PL and the body housing the projection optical system PL, similarly to the illumination optical system 28. Moreover, when $F_2$ laser light (a wavelength of 157 nm) is used as the illumination light for exposure, the reticle stage and the wafer stage are severally arranged in sub-chambers and inert gas (such as helium) is also supplied to between the illumination optical system 28 and the projection optical system PL and between the projection optical system PL and the wafer W, in addition to the illumination optical system 28 and the projection optical system PL. Therefore, in an exposure apparatus where at least part of the illumination optical path extending from the light source (including the inside of the light source) to the wafer W is sealed and where inert gas or the like is supplied to the sealed space, a chemical filter described above is preferably disposed in, for example, a position or the exit of the exhaust path for the inert gas supplied to the illumination optical system as well. Needless to say, a chemical filter may also be disposed in a position or the entrance of an intake path of the inert gas, which is particularly effective when the inert gas retrieved is used again after being cleaned. As described above, when vacuum ultraviolet light having a wavelength in the range of, for example, about 120 nm to 200 nm, is used as the illumination light for exposure, inert gas (such as nitrogen gas or helium gas) is used as gas for air conditioning. Accordingly, an air conditioner of the present invention may be an air conditioner for circulating the inert gas.

Note that although, in the above embodiment, description has been made of the case where an excimer laser such as a KrF excimer laser or a ArF excimer laser is used as the light source, not being limited to this, an $F_2$ laser or $Ar_2$ laser may be used, or that a harmonic wave generated from a metal vapor laser or a YAG laser may be used as the illumination light for exposure. Alternatively, a higher-harmonic wave may be employed which is obtained by wavelength conversion into ultraviolet using a non-linear optical crystal after amplifying single wavelength laser light, infrared or visible, emitted from a DFB semiconductor laser device or a fiber laser by a fiber amplifier having, for example, erbium (Er) (or both erbium and ytterbium (Yb)) doped.

Furthermore, this invention can be applied not only to exposure apparatuses of a step-and-repeat method, a step-and-scan method and a step-and-stitch method, but also to mirror-projection aligners, exposure apparatuses of a proximity method, and photo-repeaters. That is, the present invention can be applied to any exposure apparatus having an air conditioner regardless of the structure and arrangement of the exposure apparatus main body.

<<A Device Manufacturing Method>>

Next, an embodiment of the method of manufacturing devices using a lithography system and exposure apparatus thereof according to the above embodiments will be described.

Figure 4:
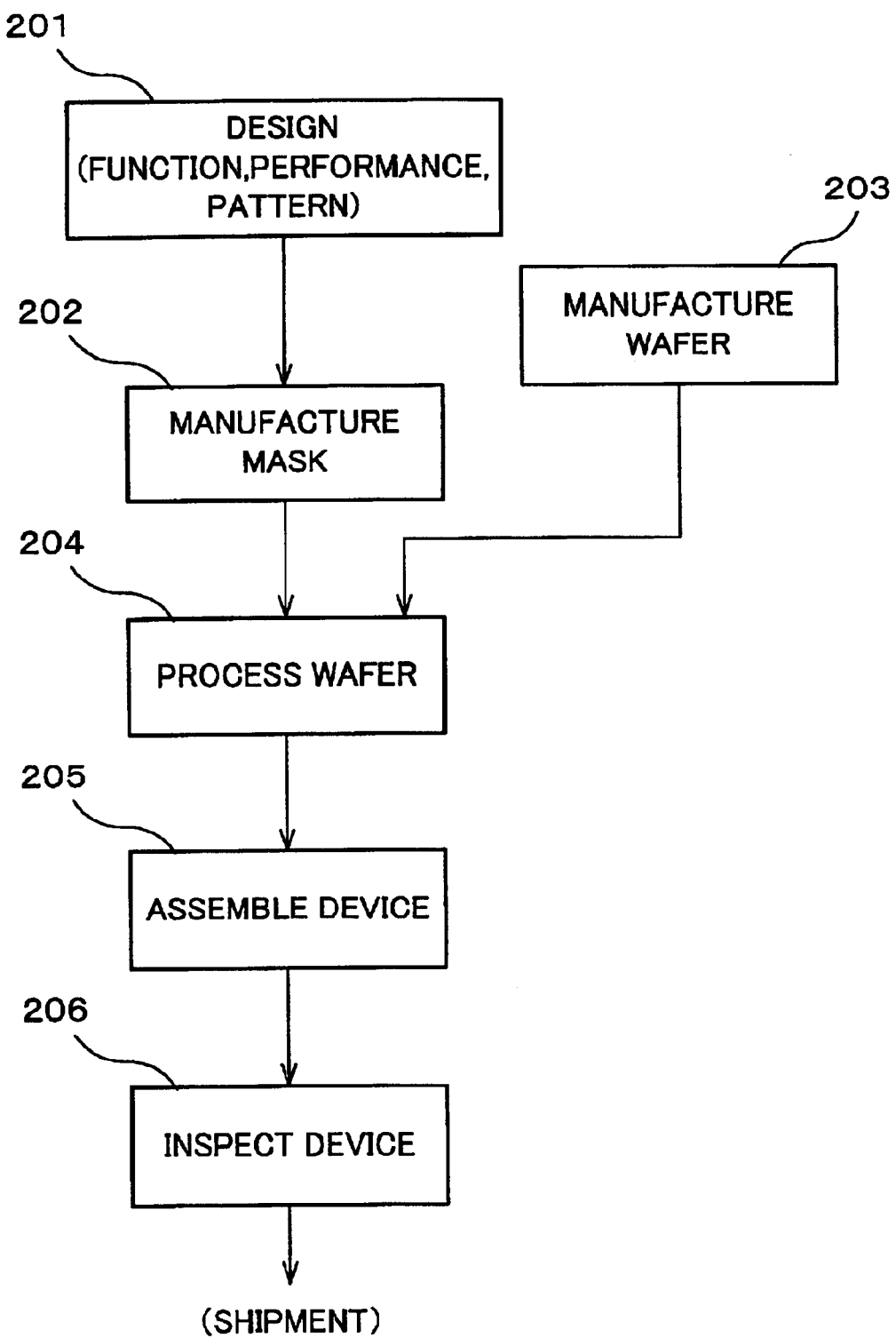
FIG. 4 is a flow chart for explaining the embodiment of a device manufacturing method according to the present invention

FIG. 4 is a flow chart for the manufacture of devices (semiconductor chips such as IC or LSI, liquid crystal panels, CCD's, thin magnetic heads, micro machines, or the like) in this embodiment. As shown in FIG. 4, in step 201 (design step), function/performance design for the devices (e.g., circuit design for semiconductor devices) is performed and pattern design is performed to implement the function. In step 202 (mask manufacturing step), masks on which a different sub-pattern of the designed circuit is formed are produced. In step 203 (wafer manufacturing step), wafers are manufactured by using silicon material or the like.

In step 204 (wafer processing step), actual circuits and the like are formed on the wafers by lithography or the like using the masks and the wafers prepared in steps 201 through 203, as will be described later. In step 205 (device assembly step), the devices are assembled from the wafers processed in step 204. Step 205 includes processes such as dicing, bonding, and packaging (chip encapsulation).

Finally, in step 206 (inspection step), a test on the operation of each of the devices, durability test, and the like are performed. After these steps, the process ends and the devices are shipped out.

Figure 5:
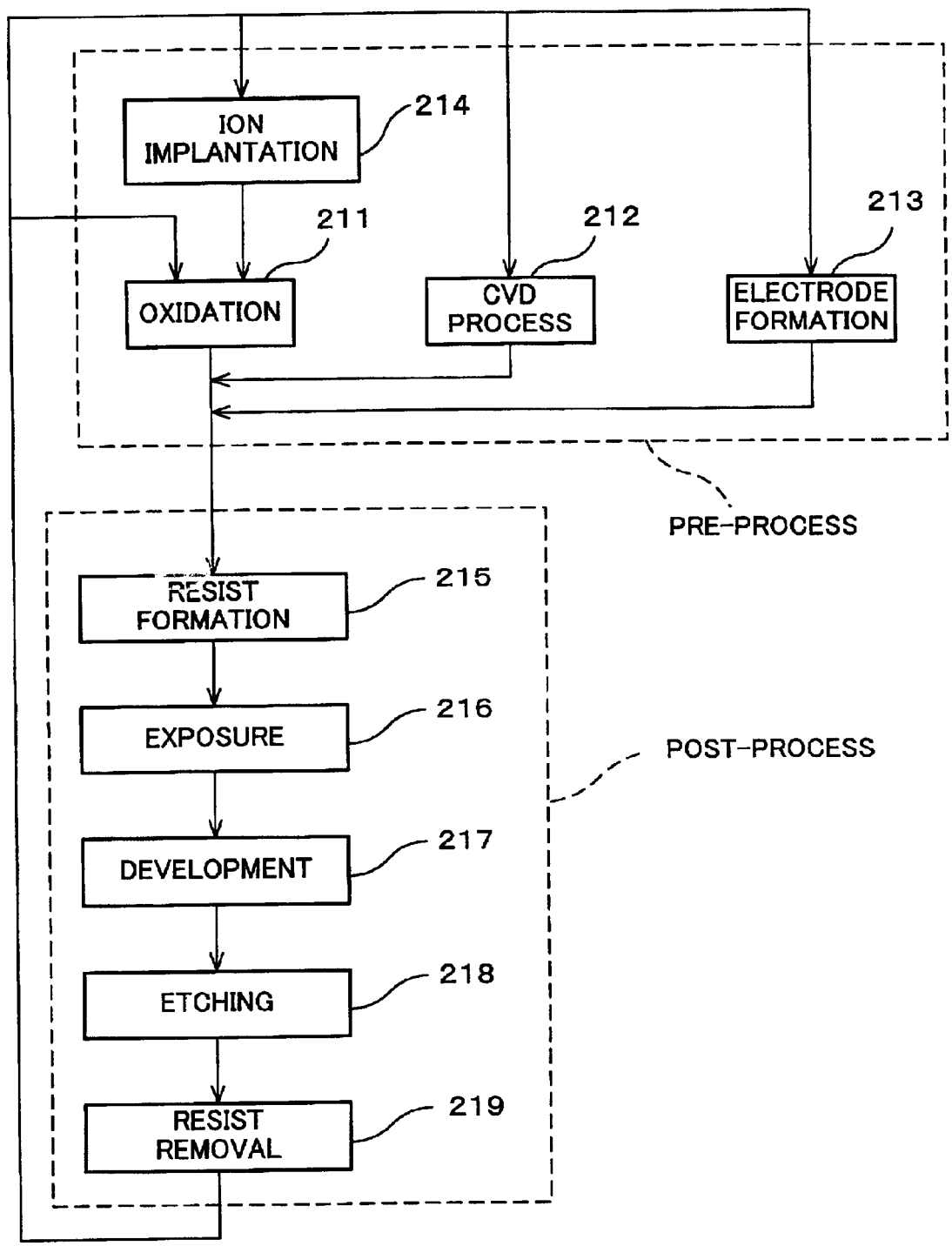
FIG. 5 is a flow chart showing processing in step 204 of FIG. 4.

FIG. 5 is a flow chart showing a detailed example of step 204 described above in manufacturing semiconductor devices. Referring to FIG. 5, in step 211 (oxidation step), the surface of a wafer is oxidized. In step 212 (CVD step), an insulating film is formed on the wafer surface. In step 213 (electrode formation step), electrodes are formed on the wafer by vapor deposition. In step 214 (ion implantation step), ions are implanted into the wafer. Steps 211 through 214 described above constitute a pre-process for each step in the wafer process and are selectively executed in accordance with the processing required in each step.

When the above pre-process is completed in each step in the wafer process, a post-process is executed as follows. In this post-process, first of all, in step 215 (resist formation step), the wafer is coated with a photosensitive material (resist). In step 216, the above exposure apparatus transfers a sub-pattern of the circuit on a mask onto the wafer according to the above method. In step 217 (development step), the exposed wafer is developed. In step 218 (etching step), an exposing member on portions other than portions on which the resist is left is removed by etching. In step 219 (resist removing step), the unnecessary resist after the etching is removed.

By repeatedly performing these pre-process and post-process, a multiple-layer circuit pattern is formed on each shot-area of the wafer.

According to the device-manufacturing method of this embodiment described above, in the exposure step (step 216), the exposure apparatus 10 of this embodiment is used, and therefore, due to improvement in the capability of maintaining the chemical cleanliness of the atmosphere inside the apparatus, improvement of the processing capacity in the long term, and reduction of the equipment cost, the productivity in manufacturing highly integrated devices can be greatly improved.

While the above-described embodiments of the present invention are the presently preferred embodiments thereof, those skilled in the art of lithography systems will readily recognize that numerous additions, modifications, and substitutions may be made to the above-described embodiments without departing from the spirit and scope thereof. It is intended that all such modifications, additions, and substitutions fall within the scope of the present invention, which is best defined by the claims appended below.

What is claimed is:

1. An exposure apparatus, comprising:
   an exposure apparatus main body that transfers a predetermined pattern onto a substrate;
   an exposure chamber that houses at least a part of said exposure apparatus main body, and in which environmental conditions are kept substantially constant;
   a machine chamber connected to said exposure chamber via a supply path and via an exhaust path;
   an air conditioner arranged in said machine chamber that includes a cooler to cool gas for air conditioning circulating within the machine chamber and that performs air conditioning inside said exposure chamber; and
   a controller that controls the surface temperature of said cooler so that condensation does not occur.

2. The exposure apparatus according to claim 1, wherein said air conditioner further includes a heater that is arranged in said machine chamber and that heats said cooled gas.

3. The exposure apparatus according to claim 1, further comprising:
   a drain pan arranged below said cooler in a direction of gravity.

4. The exposure apparatus according to claim 3, wherein said drain pan is a drain pan that is not connected to a pipe system.

5. The exposure apparatus according to claim 1, wherein said exposure apparatus main body includes a substrate stage that holds said substrate and an interferometer that measures a position of said substrate stage, and
   said exposure apparatus further comprising: another air conditioner that performs air conditioning of a part of the space inside said exposure chamber, where said substrate stage and said interferometer are arranged, independently of said air conditioner.

6. The exposure apparatus according to claim 5, wherein said another air conditioner shares a part of said air conditioner.

7. The exposure apparatus according to claim 1, wherein a surface of said substrate is coated with a chemically amplified resist as a photosensitive agent.

8. A device manufacturing method including a lithography process, wherein
   exposure is performed in said lithography process by using the exposure apparatus according to claim 1.

9. An environmental control method of an exposure apparatus that supplies gas at least the temperature of which is controlled into an exposure chamber that houses at least a part of an exposure apparatus main body such that environmental conditions are kept substantially constant inside said exposure chamber, said exposure apparatus main body transferring a predetermined pattern onto a substrate, wherein
   said gas is made to pass through a cooler before supplying said gas into said exposure chamber and the surface temperature of said cooler is set at such a temperature that condensation does not occur.

10. An exposure apparatus, comprising:
    an exposure apparatus main body that transfers a predetermined pattern onto a substrate;
    a substrate transportation system that transports said substrate to said exposure apparatus main body;
    a first chamber that houses at least a part of said exposure apparatus main body and in which environmental conditions are kept substantially constant;
    a first return duct an end of which is connected to said first chamber and through which gas exhausted from said first chamber passes;

a second chamber that houses at least a part of said substrate transportation system and in which environmental conditions are kept substantially constant;

a second return duct an end of which is connected to said second chamber and through which gas exhausted from said second chamber passes; and a first chemical substance removing filter that is connected to another end than said end of said first return duct and to another end than said end of said second return duct and that removes chemical impurities in both of gas exhausted from said first chamber and gas exhausted from said second chamber.

11. The exposure apparatus according to claim 10, further comprising:

a mask transportation system that transports a mask on which said predetermined pattern is formed.

12. The exposure apparatus according to claim 11, wherein said mask transportation system includes a storing section that stores a plurality of masks.

13. The exposure apparatus according to claim 11, further comprising:

a third chamber that houses at least a part of said mask transportation system and in which environmental conditions are kept substantially constant; and a third return duct an end of which is connected to said third chamber and through which gas exhausted from said third chamber passes, and wherein another end than said end of said third return duct is connected to said chemical substance removing filter together with said another end of said first return duct and said another end of said second return duct.

14. The exposure apparatus according to claim further comprising:

a machine chamber in which a cooler, a heater and a blower that blows temperature- adjusted gas to said first chamber are arranged, and wherein said first chemical substance removing filter is arranged inside said machine chamber and is connected to both of said another end of said first return duct and said another end of said second return duct via an opening made in part of said machine chamber.

15. The exposure apparatus according to claim 14, further comprising:

a second chemical substance removing filter that is arranged in part of a supply path for supplying temperature-adjusted gas from said machine chamber at least to said first chamber and removes chemical impurities in said temperature-adjusted gas.

16. The exposure apparatus according to claim 15, wherein said machine chamber and said first chamber are connected to each other to be separable, and wherein said second chemical substance removing filter is arranged in the vicinity of the connection between said machine chamber and said first chamber.

17. An environmental controller suitable for environmental control inside an environmental control chamber in which an exposure apparatus that transfers a predetermined pattern onto a substrate is arranged, said environmental controller comprising:

a blower that blows air into said environmental control chamber;

a cooler that is arranged upstream of said blower and cools down the air blown into said environmental control chamber by said blower;

a sensor that is arranged on said cooler and detects the temperature of a surface of said cooler; and a controller that controls said cooler in accordance with a detection result of the surface temperature of said cooler supplied from said sensor so that condensation does not occur on the surface of the cooler.

18. The environmental controller according to claim 17, wherein said controller controls said cooler in accordance with a detection result of said sensor so that condensation does not occur on the surface of said cooler in the humidity and pressure of air passing through said cooler.

19. The environmental controller according to claim 18, further comprising:

a drain pan that is arranged below said cooler and has no pipe system connected to the outside.

20. The environmental controller according to claim 19, wherein said controller controls said cooler in accordance with a detection result of said sensor to maintain said surface temperature between 5° C. and 15° C. so that condensation does not occur on the surface of said cooler.

* * * * *

UNITED STATES PATENT AND TRADEMARK OFFICE
CERTIFICATE OF CORRECTION

PATENT NO. : 6,784,972 B2
DATED : August 31, 2004
INVENTOR(S) : Yoshitomo Nagahashi et al.

It is certified that error appears in the above-identified patent and that said Letters Patent is hereby corrected as shown below:

Title page,
Item [*] Notice, after "(*) Notice:" delete "This patent is subject to a terminal disclaimer.".

Item [56], References Cited, FOREIGN PATENT DOCUMENTS, delete "5-318538" and insert -- 6-318538 --.

Signed and Sealed this

Twenty-second Day of February, 2005

JON W. DUDAS
*Director of the United States Patent and Trademark Office*

UNITED STATES PATENT AND TRADEMARK OFFICE
CERTIFICATE OF CORRECTION

PATENT NO. : 6,784,972 B2
DATED : August 31, 2004
INVENTOR(S) : Yoshitomo Nagahashi et al.

It is certified that error appears in the above-identified patent and that said Letters Patent is hereby corrected as shown below:

Title page,
Item [*] Notice, after "[*] Notice: Subject to any disclaimer, the term of this patent is extended or adjusted under 35 U.S.C. 154(b) by 77 days.", delete "This patent is subject to a terminal disclaimer.".
Item [56], References Cited, FOREIGN PATENT DOCUMENTS, delete "5-318538" and insert -- 6-318538 --.

Signed and Sealed this

Eighth Day of March, 2005

JON W. DUDAS
*Director of the United States Patent and Trademark Office*